United States Patent
Karakas et al.

(10) Patent No.: US 10,529,589 B2
(45) Date of Patent: Jan. 7, 2020

(54) METHOD OF PLASMA ETCHING OF SILICON-CONTAINING ORGANIC FILM USING SULFUR-BASED CHEMISTRY

(71) Applicant: Tokyo Electron Limited, Minato-ku, Tokyo (JP)

(72) Inventors: Erdinc Karakas, Hillsboro, OR (US); Li Wang, Hillsboro, OR (US); Andrew Nolan, Albany, NY (US); Christopher Talone, Albany, NY (US); Shyam Sridhar, Albany, NY (US); Alok Ranjan, Austin, TX (US); Hiroto Ohtake, Hillsboro, OR (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/995,173

(22) Filed: Jun. 1, 2018

(65) Prior Publication Data

US 2018/0358233 A1    Dec. 13, 2018

Related U.S. Application Data

(60) Provisional application No. 62/516,941, filed on Jun. 8, 2017.

(51) Int. Cl.
*H01L 21/3213* (2006.01)
*H01L 21/311* (2006.01)
*H01L 21/3065* (2006.01)
*H01L 21/033* (2006.01)
*H01L 21/027* (2006.01)

(52) U.S. Cl.
CPC .... *H01L 21/32137* (2013.01); *H01L 21/0276* (2013.01); *H01L 21/0332* (2013.01); *H01L 21/0337* (2013.01); *H01L 21/3065* (2013.01); *H01L 21/31116* (2013.01); *H01L 21/31138* (2013.01); *H01L 21/31144* (2013.01)

(58) Field of Classification Search
None
See application file for complete search history.

(56) References Cited

U.S. PATENT DOCUMENTS

2009/0194503 A1 * 8/2009 Ko ............... H01J 37/32091
                                                          216/47
2019/0051526 A1 * 2/2019 Khang ............... H01L 21/266

* cited by examiner

*Primary Examiner* — Jiong-Ping Lu
(74) *Attorney, Agent, or Firm* — Rothwell, Figg, Ernst & Manbeck, P.C.

(57) ABSTRACT

A method of etching is described. The method providing a substrate having a first material composed of silicon-containing organic material and a second material that is different from the first material, forming a chemical mixture by plasma-excitation of a process gas containing $SF_6$ and an optional inert gas, controlling a processing pressure at or above 100 mtorr, and exposing the first material on the substrate to the chemical mixture to selectively etch the first material relative to the second material.

21 Claims, 2 Drawing Sheets

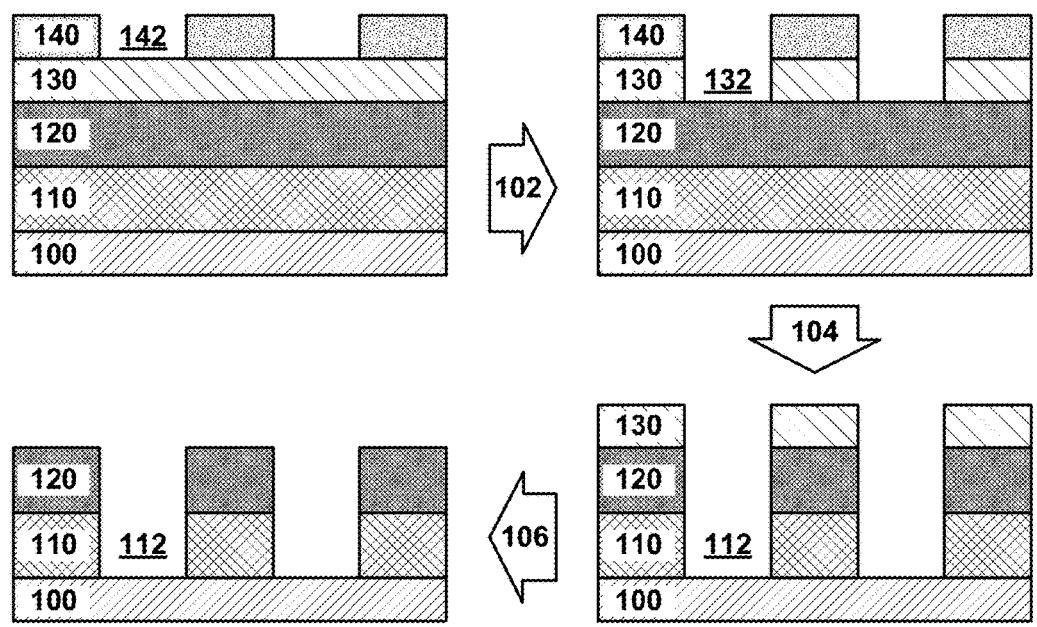
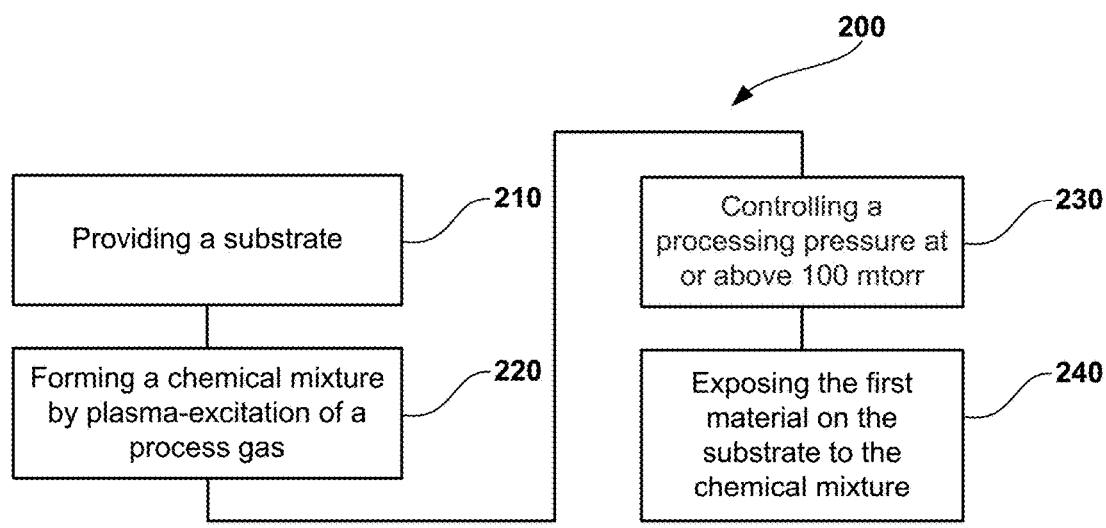
FIG. 2

METHOD OF PLASMA ETCHING OF SILICON-CONTAINING ORGANIC FILM USING SULFUR-BASED CHEMISTRY

RELATED APPLICATIONS

This application claims priority to the following pending provisional application: U.S. Provisional Patent Application Ser. No. 62/516,941, filed Jun. 8, 2017, and entitled "METHOD OF PLASMA ETCHING OF SILICON-CONTAINING ORGANIC FILM USING SULFUR-BASED CHEMISTRY" which is hereby incorporated by reference in its entirety.

FIELD OF INVENTION

The invention relates to a method for etching, and more particularly, a precision etch technique for etching a thin film for electronic device applications.

BACKGROUND OF THE INVENTION

The present invention relates to a method of manufacturing a semiconductor device such as an integrated circuit and transistors and transistor components for an integrated circuit. In the manufacture of a semiconductor device (especially on the microscopic scale), various fabrication processes are executed such as film-forming depositions, etch mask creation, patterning, material etching and removal, and doping treatments, are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other.

As device structures densify and develop vertically, the need for precision material etch becomes more compelling. Trade-offs between selectivity, profile, ARDE (aspect ratio dependent etching), and uniformity in plasma etch processes become difficult to manage. Current approaches to patterning and pattern transfer by balancing these trade-offs is not sustainable. The root cause for these trade-offs is the inability to control ion energy, ion flux, and radical flux independently. However, selective plasma etching processes offer a viable route to escape these trade-offs by providing process window breadth to achieve target etch performance required by device makers.

SUMMARY

Techniques herein pertain to device fabrication using precision etch techniques.

A method of etching is described. The method includes providing a substrate having a first material composed of silicon-containing organic material and a second material that is different from the first material, forming a chemical mixture by plasma-excitation of a process gas containing $SF_6$ and an optional inert gas, controlling a processing pressure at or above 100 mtorr, and exposing the first material on the substrate to the chemical mixture to selectively etch the first material relative to the second material.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

In the accompanying drawings:

FIG. 1 illustrates a schematic representation of a method of etching a thin film on a substrate according to an embodiment;

FIG. 2 provides a flow chart illustrating a method of etching a substrate according to an embodiment.

DETAILED DESCRIPTION

Figure 3A:
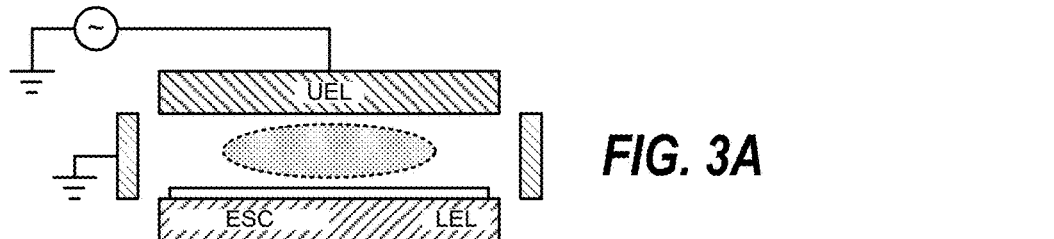
FIGS. 3A through 3D provide schematic illustrations of plasma processing systems for performing the method of etching according to various embodiments.

Techniques herein pertain to device fabrication using precision etch techniques. Several instances manifest in semiconductor manufacturing in both front end of line (FEOL, e.g., transistor fabrication) through to the back end of line (BEOL, e.g., interconnect fabrication), where mask layers, oxide and nitride films (typically silicon-containing, in nature), silicon and metal layers, etc. need to be etched with a high degree of precision.

Numerous fabrication sequences in semiconductor manufacturing demand precision etch techniques for both 2D (two-dimensional) and 3D (three-dimensional) device structures. Still, tri-layer etch masks (e.g., including photoresist, anti-reflective coatings (ARC), and organic carbon films) serve as the workhorse of patterning masks into the underlying layer. Current challenges involve obtaining pattern transfer with no loading artifacts, vertical sidewall profile and square bottom with immense selectivity to the ARC layer. Continuous plasma etch process do not allow a solution to such challenges.

According to various embodiments, precision plasma etching techniques using chemistries including sulfur-based chemistry are described for etching silicon-containing organic material films. For sulfur-based chemistry, gaseous chemistries include sulfur (S) and a halogen element (e.g., $SF_6$ and $SF_6$-containing gas mixtures) for etching silicon-containing organic films with or without various layers as a mask. In particular, such chemistries can be used to etch silicon-containing organic materials with selectivity to other materials present and/or exposed on the substrate. The other materials present and/or exposed on the substrate can include silicon, carbon, metal, or silicon and at least one element selected from the group consisting of O, N, C, and Ge. For example, the other material can contain Si and O.

According to several embodiments, FIGS. 1 and 2 illustrate a method of etching one or more films in a film stack. The method, depicted as flow chart 200, includes in 210, providing a substrate having a first material 130 composed of a silicon-containing organic material and a second material 100 that is different from the first material 130. Silicon-containing organic materials can include silicon-containing organic material having a silicon content less than or equal to 20% by weight. Alternatively, silicon-containing organic materials can include silicon-containing organic material having a silicon content greater than or equal to 20% by weight. Alternatively yet, silicon-containing organic materials can include silicon-containing organic material having a silicon content greater than or equal to 40% by weight. Silicon-containing organic materials can include silicon-containing anti-reflective coatings (ARC).

As shown in FIG. 1, a patterned mask 140 with pattern 142 formed there through can overly the first material 130. Furthermore, the substrate can include one or more layers 110, 120 positioned between the first material 130 and the second material 100. For example, the patterned mask 140 can include photoresist. Additionally, for example, the one or more layers can include silicon, carbon, metal, or silicon and at least one element selected from the group consisting of O, N, C, and Ge.

The first material 130 on the substrate can be exposed through pattern 142 to a first chemical mixture, optionally including plasma, to extend pattern 132 into the first material 130, which is depicted as 102 in FIG. 1. Thereafter, the substrate can be exposed through pattern 132 to a second chemical mixture, optionally including plasma, to extend pattern 112 into the one or more layers 110, 120, which is depicted as 104 in FIG. 1. During pattern transfer, or following pattern transfer, the patterned mask 140 can be removed. Then, following removal of the patterned mask 140, the first material 130 is removed, which is depicted as 106 in FIG. 1.

When removing or etching the first material 130, a chemical mixture is formed by plasma-excitation of a process gas containing $SF_6$ and an optional inert gas in 220. In one embodiment, the process gas contains a noble element. In another embodiment, the first process gas further contains $N_2$, $O_2$, a compound having both S and O, or $C_xH_yF_z$, where x, y, and z are integers greater than or equal to zero, or a combination thereof. In yet another embodiment, the process gas contains $SF_6$, COS, $N_2$, $O_2$, $CH_3F$, and Ar. The flow rate of each constituent can be varied. For example, the flow rate of each constituent can exceed the flow rate of $SF_6$. In another example, the flow rate of $SF_6$ can range from 1 sccm to 100 sccm, or preferably from 5 sccm to 30 sccm.

In 230, the processing pressure is controlled to a value equal to or greater than 100 mTorr. In an embodiment, the processing pressure exceeds 150 mTorr. In another embodiment, the processing pressure exceeds 200 mTorr. In another embodiment, the processing pressure exceeds 250 mTorr. In another embodiment, the processing pressure exceeds 300 mTorr. In yet another embodiment, the processing pressure exceeds 500 mTorr.

In 240, the first material 130 on the substrate is exposed to the chemical mixture to selectively etch the first material 130 relative to the second material 100. As shown in FIG. 1, a lithographic pattern extends through the first material 130, and exposes the second material 100. The second material 100 can include Si and O, and for example, can include $SiO_2$. During the exposing, the first material 130 is substantially removed, and the amount of second material 100 removed is less than or equal to 5 nm, and preferably less than 3 nm.

In some embodiments, the first material 130 is removed prior to exposing the second material 100. In other embodiments, the first material 130 is removed after exposing the second material 100. In the latter, when one or more layers 110, 120 exist in the film stack, oxygen-free, e.g., $O_2$-free, chemistry can be used to perform the pattern transfer to the one or more layers 110, 120.

The plasma-excitation of the first process gas can be performed in-situ (i.e., the first and/or second chemical mixture is formed within a gas-phase, vacuum environment in proximate contact with the substrate), or ex-situ (i.e., the first and/or second chemical mixture is formed within a gas-phase, vacuum environment remotely located relative to the substrate). FIGS. 3A through 3D provide several plasma generating systems that may be used to facilitate plasma-excitation of a process gas. FIG. 3A illustrates a capacitively coupled plasma (CCP) system, wherein plasma is formed proximate a substrate between an upper plate electrode (UEL) and a lower plate electrode (LEL), the lower electrode also serving as an electrostatic chuck (ESC) to support and retain the substrate. Plasma is formed by coupling radio frequency (RF) power to at least one of the electrodes. As shown in FIG. 3A, RF power is coupled to both the upper and lower electrodes, and the power coupling may include differing RF frequencies. Alternatively, multiple RF power sources may be coupled to the same electrode. Moreover, direct current (DC) power may be coupled to the upper electrode.

Figure 3B:
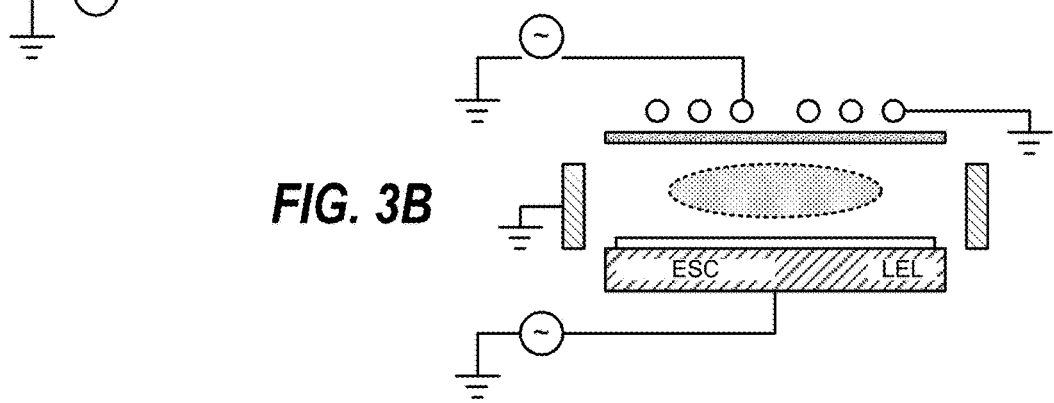

FIG. 3B illustrates an inductively coupled plasma (ICP) system, wherein plasma is formed proximate a substrate between an inductive element (e.g., a planar, or solenoidal/helical coil) and a lower plate electrode (LEL), the lower electrode also serving as an electrostatic chuck (ESC) to support and retain the substrate. Plasma is formed by coupling radio frequency (RF) power to the inductive coupling element. As shown in FIG. 3B, RF power is coupled to both the inductive element and lower electrode, and the power coupling may include differing RF frequencies.

Figure 3C:
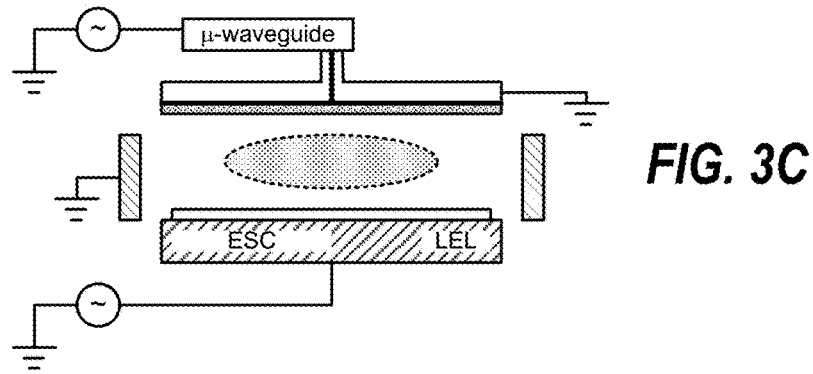

FIG. 3C illustrates a surface wave plasma (SWP) system, wherein plasma is formed proximate a substrate between a slotted plane antenna and a lower plate electrode (LEL), the lower electrode also serving as an electrostatic chuck (ESC) to support and retain the substrate. Plasma is formed by coupling radio frequency (RF) power at microwave frequencies through a waveguide and coaxial line to the slotted plane antenna. As shown in FIG. 3C, RF power is coupled to both the slotted plane antenna and lower electrode, and the power coupling may include differing RF frequencies.

Figure 3D:
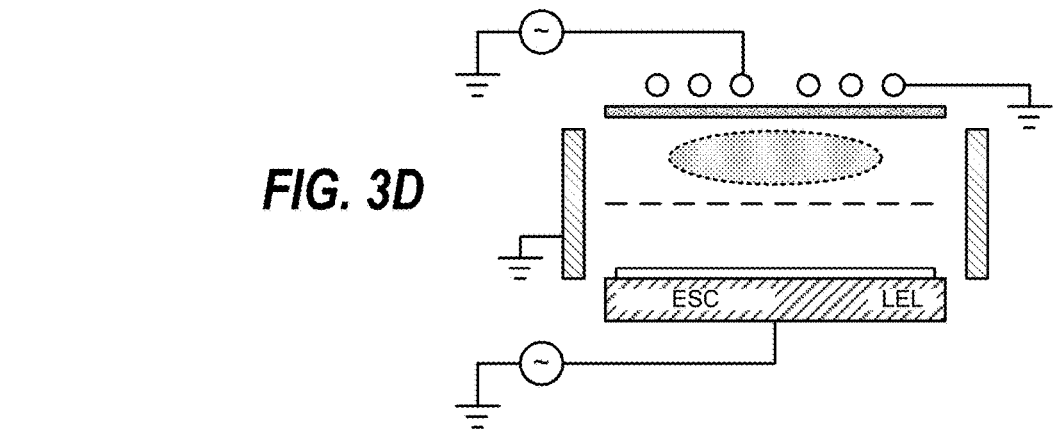

FIG. 3D illustrates remote plasma system, wherein plasma is formed in a region remote from a substrate and separated from the substrate by a filter arranged to impede the transport of charged particles from the remote plasma source to a processing region proximate the substrate. The substrate is supported by a lower plate electrode (LEL) that also serves as an electrostatic chuck (ESC) to retain the substrate. Plasma is formed by coupling radio frequency (RF) power to a plasma generating device adjacent the remotely located region. As shown in FIG. 3D, RF power is coupled to both the plasma generating device adjacent the remote region and lower electrode, and the power coupling may include differing RF frequencies.

The plasma processing systems of FIGS. 3A through 3D are intended to be illustrative of various techniques for implementing the stepped ion/radical process described.

Other embodiments are contemplated including both combinations and variations of the systems described.

When forming the first chemical mixture by plasma-excitation of the first process gas containing aninert gas, such as a noble gas, and exposing the first material on the substrate to the first chemical mixture, the gas pressure for the exposing can be less than or equal to 1000 mTorr. For example, the gas pressure may range from 10 mTorr to 100 mTorr. Additionally, the substrate may be electrically biased by coupling RF power to the lower plate electrode (LEL). RF power may or may not also be applied to the plasma generating device.

When forming the second chemical mixture by plasma-excitation of the second process gas containing S and O, such as COS or $SO_2$, $O_2$, and optionally a noble gas, and exposing the second material on the substrate to the second chemical mixture, the gas pressure for the exposing can be less than or equal to 1000 mTorr. For example, the gas pressure may range from 10 mTorr to 100 mTorr. Additionally, the substrate may be electrically biased by coupling RF power to the lower plate electrode (LEL). RF power may or may not also be applied to the plasma generating device.

When forming the first chemical mixture by plasma-excitation of the first process gas containing a noble gas (e.g., Ar), and exposing the first material on the substrate to the first chemical mixture, and when forming the second chemical mixture by plasma-excitation of the second process gas containing S and O (e.g., COS or $SO_2$) the inventors have observed a cyclic plasma etch that results in (i) little to no lateral etch, (ii) little to no mask undercut, and (iii) little to no aspect ratio dependent etch (ARDE).

In the claims below, any of the dependents limitations can depend from any of the independent claims.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of etching, comprising:
providing a substrate having a patterned mask, a first material composed of silicon-containing organic material exposed through a pattern of the patterned mask, a second material that is different from the first material, and plural layers positioned between the first material and the second material;
forming a chemical mixture by plasma-excitation of a process gas containing $SF_6$ and an optional inert gas;
controlling a processing pressure at or above 100 mtorr; and
exposing the first material on the substrate to the chemical mixture to selectively etch the first material, and thereby extending the pattern of the patterned mask into the first material to form a patterned first material and exposing one of the plural layers through the patterned first material;
etching the plural layers through a pattern formed in the patterned first material to expose the second material through the plural layers;
removing remaining portions of the patterned first material after etching of the plural layers, wherein during at least part of the removing of the remaining portions of the patterned first material the second material is exposed through the plural layer, and wherein the removing of the remaining portions of the first material includes using a removal gas mixture which includes $SF_6$.

2. The method of claim 1, wherein the silicon-containing organic material has a silicon content less than or equal to 20% by weight and greater than 0% by weight.

3. The method of claim 1, wherein the silicon-containing organic material has a silicon content greater than or equal to 40% by weight and less than 100% by weight.

4. The method of claim 1, wherein the silicon-containing organic material is a silicon-containing anti-reflective coating (SiARC).

5. The method of claim 1, wherein the second material includes Si and O.

6. The method of claim 5, wherein the second material includes $SiO_2$.

7. The method of claim 5, wherein during removing remaining portions of the patterned first material while the second material is exposed, the amount of second material removed is less than or equal to 5 nm.

8. The method of claim 5, wherein during removing remaining portions of the patterned first material while the second material is exposed, the amount of second material removed is less than or equal to 3 nm.

9. The method of claim 1, wherein the plural layers include silicon, carbon, or silicon and at least one element selected from the group consisting of O, N, C, and Ge.

10. The method of claim 1, wherein the process gas contains a noble element.

11. The method of claim 1, wherein the first process gas further contains $N_2$, $O_2$, a compound having both S and O, or $C_xH_yF_z$, where x, y, and z are integers greater than or equal to zero, or a combination thereof.

12. The method of claim 1, wherein the processing pressure is at or above 200 mtorr.

13. The method of claim 1, wherein the plasma excitation of the process gas includes generating plasma using a capacitively coupled plasma source containing an upper plate electrode, and a lower plate electrode supporting the substrate.

14. The method of claim 1, wherein the plasma excitation of the process gas includes generating plasma using an inductively coupled plasma source containing an inductive element, and a lower plate electrode supporting the substrate.

15. A method of etching, comprising:
providing a substrate having a first material composed of silicon-containing organic material and a second material that is different from the material;
forming a chemical mixture by plasma-excitation of a process gas containing $SF_6$ and an optional inert gas;
controlling a processing pressure in the processing space; and
exposing the first material on the substrate to the chemical mixture to selectively etch the first material relative to the second material;
wherein a lithographic pattern extends through the first material, and exposes the second material;
wherein the substrate includes one or more layers positioned between the first material and the second material; and
wherein the lithographic pattern is extended through the one or more layers between the first material and the second material using an oxygen-free etching process.

16. The method of claim 15, wherein the oxygen-free etching process contains HBr.

17. The method of claim 15, wherein the first material is substantially removed during the exposing after the lithographic pattern is extended through the one or more layers between the first material and the second material.

18. A method of etching comprising:
providing a substrate having a patterned mask, a first material exposed through the patterned mask, a second material below the first material, and at least one intermediate layer between the first material and the second material, wherein the first material includes a silicon-containing organic material, and the second material includes Si and O;
etching the first material through the patterned mask to form a patterned first material through which the intermediate layer is exposed;
etching the at least one intermediate layer through the patterned first material to expose the second material through the at lest one intermediate layer; and
after exposing the second material, removing remaining portions of the patterned first material with a removal gas which includes $SF_6$ such that the patterned first material is selectively removed with respect to the second material.

19. The method of claim 18, wherein during removing of the remaining portions of the patterned first material while the second material is exposed an amount of the second material removed is less than or equal to 5 nm.

20. The method of claim 18, wherein the first material is a silicon-containing anti-reflective coating, and the second material includes $SiO_2$.

21. The method of claim 18, wherein:
the etching the at least one intermediate layer includes an oxygen-free etching process; and
during removing of the remaining portions of the patterned first material a process pressure is controlled to at or above 100 mtorr.

* * * * *

UNITED STATES PATENT AND TRADEMARK OFFICE
CERTIFICATE OF CORRECTION

PATENT NO. : 10,529,589 B2
APPLICATION NO. : 15/995173
DATED : January 7, 2020
INVENTOR(S) : Erdinc Karakas et al.

Page 1 of 1

It is certified that error appears in the above-identified patent and that said Letters Patent is hereby corrected as shown below:

In the Claims

Claim 1, Column 6, Line 38, "plural layer" should be "plural layers."

Signed and Sealed this
Fifth Day of May, 2020

Andrei Iancu
*Director of the United States Patent and Trademark Office*